United States Patent
Hamanishi et al.

[11] Patent Number: 6,084,476
[45] Date of Patent: Jul. 4, 2000

[54] OPERATIONAL AMPLIFIER

[75] Inventors: Naoyuki Hamanishi, Ichikawa; Kazuhiro Oda, Isogo-Ku, both of Japan

[73] Assignee: Kabushiki Kaisha Toshiba, Kawasaki, Japan

[21] Appl. No.: 09/255,698

[22] Filed: Feb. 23, 1999

[30] Foreign Application Priority Data

Feb. 23, 1998 [JP] Japan .................................. 10-040166

[51] Int. Cl.$^7$ ...................................................... H03F 3/45
[52] U.S. Cl. ........................................... 330/255; 330/253
[58] Field of Search ..................................... 330/253, 255

[56] References Cited

U.S. PATENT DOCUMENTS

| | | | |
|---|---|---|---|
| 4,335,355 | 6/1982 | Haque | 330/253 |
| 4,524,329 | 6/1985 | Abou | 330/255 |
| 4,668,919 | 5/1987 | De Weck | 330/255 |
| 4,912,425 | 3/1990 | Kobayashi et al. | 330/255 |
| 5,285,168 | 2/1994 | Tomatsu et al. | 330/255 |
| 5,289,058 | 2/1994 | Okamoto | 330/253 |
| 5,907,259 | 5/1999 | Yamada et al. | 330/253 |
| 5,909,146 | 6/1999 | Okada | 330/255 |

*Primary Examiner*—Robert Pascal
*Assistant Examiner*—Khanh Van Nguyen
*Attorney, Agent, or Firm*—Oblon, Spivak, McClelland, Maier & Neustadt, P.C.

[57] ABSTRACT

In an operational amplifier constituted by a differential stage which receives two input signals IN− and IN+ and outputs a signal NGP corresponding to the potential difference, a level shift stage which receives the signal NGP and outputs a level-shifted signal NGN, and an output stage which receives the signals NGP and NGN and outputs a signal OUT obtained by amplifying the potential difference between the two input signals, the level shift stage is formed from a DDA. Letting A1, A2, and A3 be the gains of the DDA, the input signal NGP, output signal NGN, and bias voltages VBP and VBN have a linear relation given by $A3\{A1(VBN-NGN)-A2(VBP-NGP)\}=NGN$. This maximizes the current drivability of a transistor TN1 on the output stage and controls the punch-through current flowing between transistors TP1 and TN1.

7 Claims, 12 Drawing Sheets

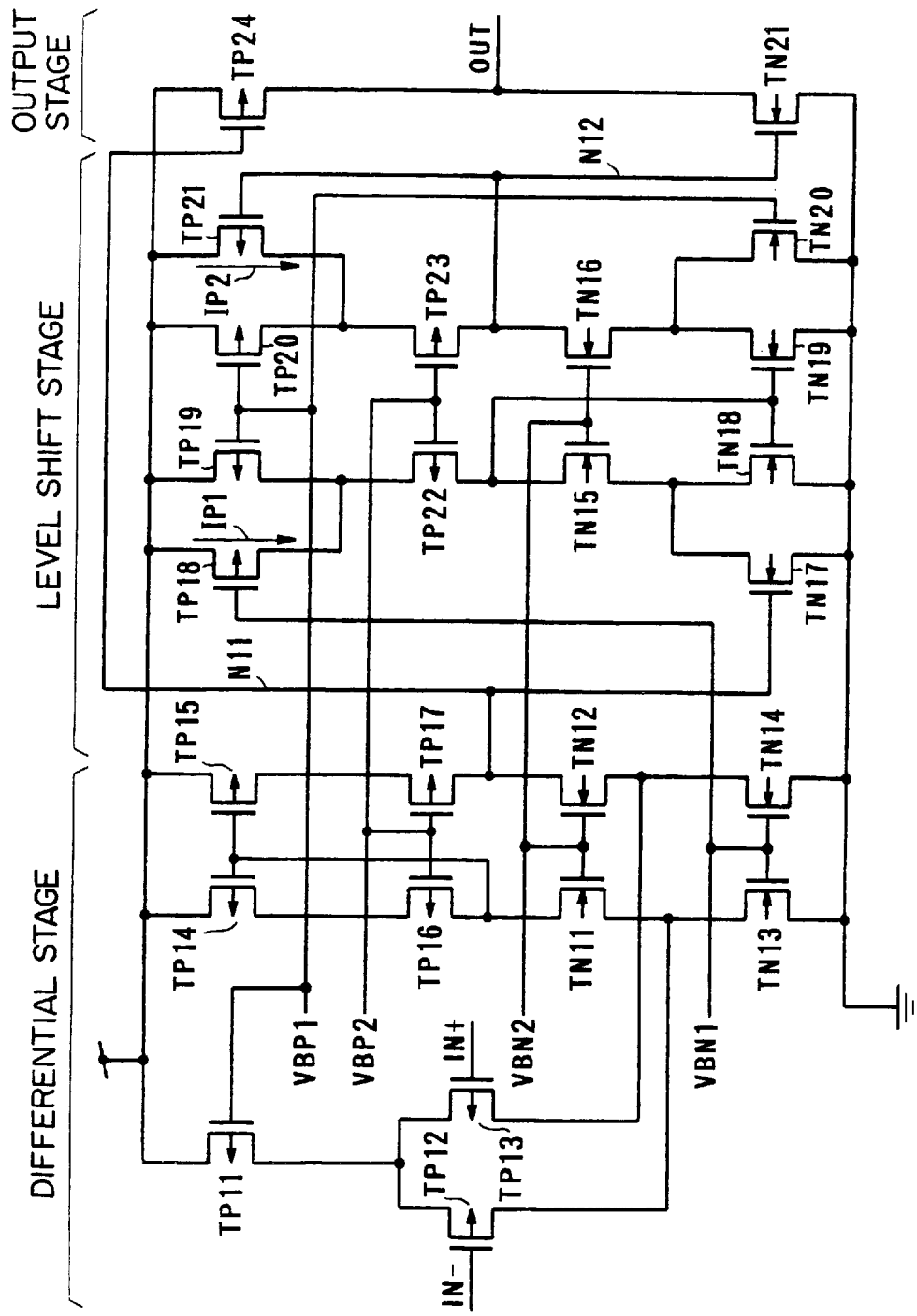
F I G. 5

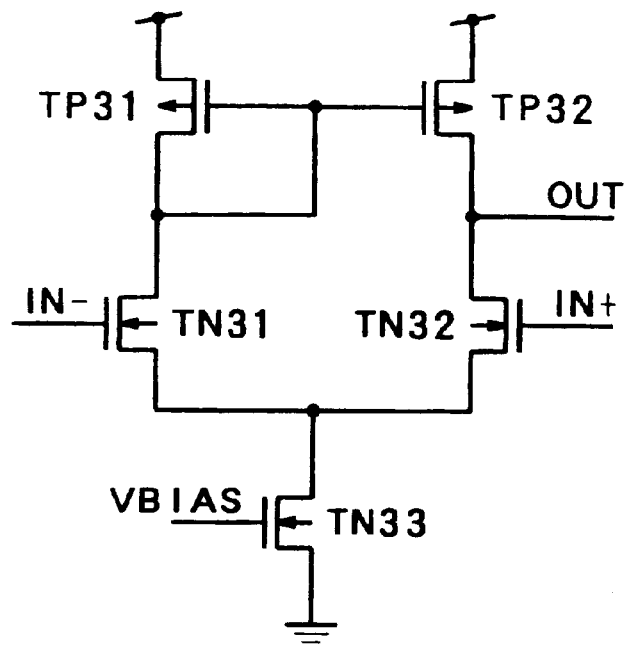
F I G. 6
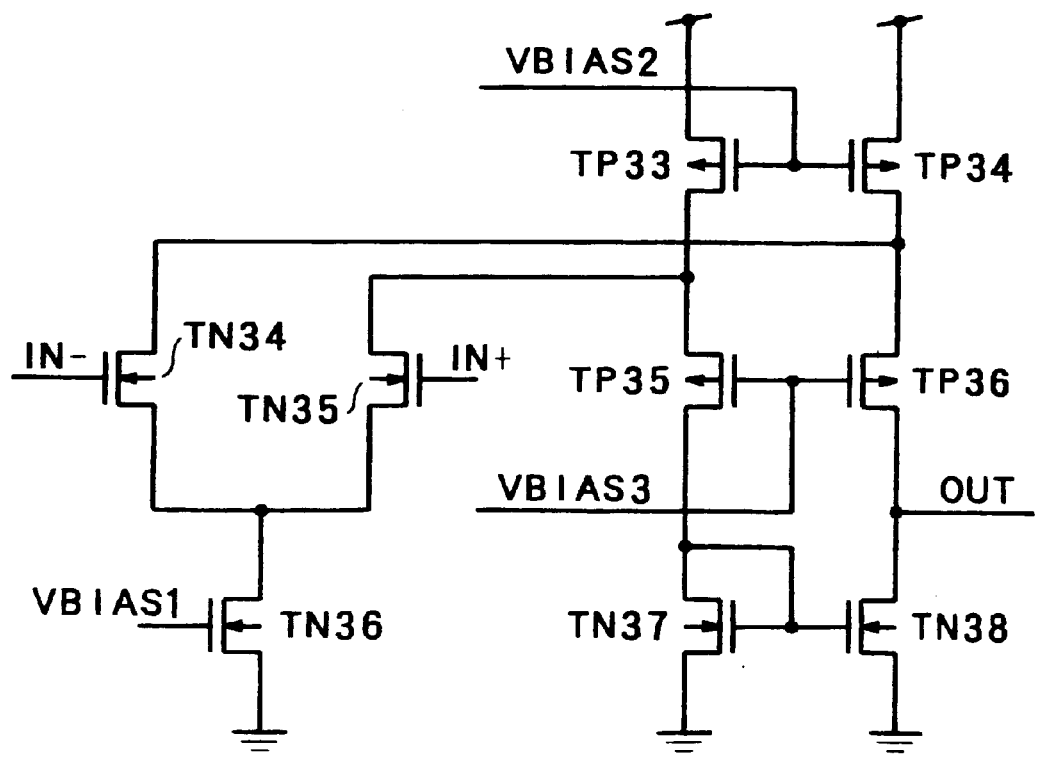
F I G. 7

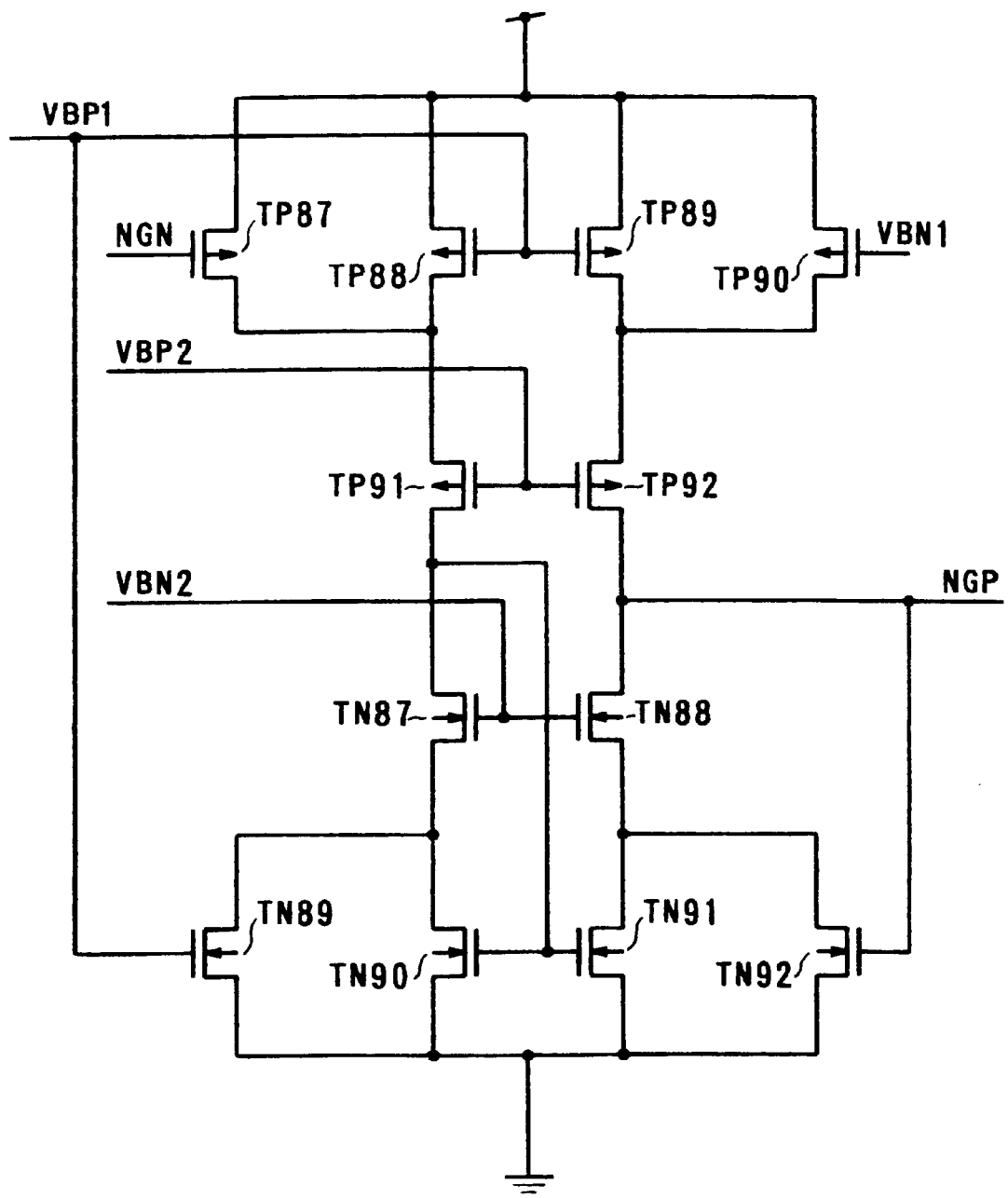
F I G. 13

OPERATIONAL AMPLIFIER

BACKGROUND OF THE INVENTION

The present invention relates to an operational amplifier widely used in general-purpose analog circuits and, more particularly, to an operational amplifier using a CMOS circuit. The operational amplifier of the present invention can be suitably used in applications that demand a large drive current, such as an output buffer of a loudspeaker.

An operational amplifier related to the present invention has the arrangement shown in FIG. 1. This operational amplifier comprises a differential stage which receives two input signals IN− and IN+ and outputs a signal corresponding to the difference between the two input signals from a node N1, and an output stage which outputs a signal OUT corresponding to the difference between the two input signals IN− and IN+ based on the output signal from the node N1.

The differential stage has p-channel MOS transistors TP101 and TP102, and n-channel MOS transistors TN101, TN102, and TN103. The sources of the transistors TP101 and TP102 are connected to a power supply voltage terminal $V_{DD}$, and their gates are connected to the drain of the transistor TP101.

The drain of the transistor TN101 is connected to the drain of the transistor TP101, and the drain of the transistor TN102 to the drain of the transistor TP102. The gate of the transistor TN101 receives the input signal IN−, and the gate of the transistor TN102 receives the input signal IN+. The sources of the transistors TN101 and TN102 are commonly connected to the drain of the transistor TN103, and the source of the transistor TN103 is grounded. The gate of the transistor TN103 receives a predetermined bias voltage VBIAS and is normally ON together with the gate of the transistor TN104 on the output stage.

The output stage has a p-channel MOS transistor TP103 and an n-channel MOS transistor TN104. The transistor TP103 has a source connected to the power supply voltage terminal $V_{DD}$, a gate connected to the node N1, and a drain connected to an output terminal OUT. The transistor TN104 has a drain connected to the output terminal OUT, a grounded source, and a gate that receives the predetermined voltage VBIAS to normally keep the transistor TN104 ON.

In the operational amplifier having this arrangement, the output current extracted from the output terminal is limited. This is because the gate of the transistor TN104 receives the predetermined bias voltage VBIAS to normally keep the voltage between the gate and source constant, and even when a high-level output signal OUT is to be output, a current always flows through the transistor TN104.

To obtain a larger output current, the transistor TP103 on the output stage must be set to a large size.

To solve this problem, a push-pull operational amplifier is proposed, and its circuit arrangement is shown in FIG. 2. This push-pull operational amplifier has the same differential and output stages as in the operational amplifier shown in FIG. 1 except that a level shift stage having n-channel MOS transistors TN104 and TN105 is arranged between the differential and output stages.

The transistor TN104 has a source connected to a power supply voltage terminal $V_{DD}$, a gate connected to a node N1 on the differential stage, and a source connected to the gate of a transistor TN104 via a node N2 together with the drain of the transistor TN105. The gate of the transistor TN105 receives a bias voltage VBIAS together with a transistor TN103, and the source of the transistor TN105 is grounded.

In this operational amplifier, the gate of the transistor TN104 on the output stage receives not the predetermined bias voltage VBIAS but a signal at the output node N2 on the level shift stage. The signal at the node N2 has a potential prepared by converting on the level shift stage the level of the potential of the output node N1 on the differential stage.

More specifically, when the output node N1 on the differential amplification stage falls to a ground voltage Vcc, the ON resistance of a transistor TP103 on the output stage decreases toward an ON state. In this case, the ON resistance of the transistor TN104 increases toward an OFF state, the level-converted potential of the output node N2 falls further toward a ground voltage Vss, and thus the transistor TN104 operates toward an OFF state. When, therefore, an output signal OUT rises toward the level of the power supply voltage Vss, the ON resistance of the transistor TN104 increases further to an OFF state to decrease the current flowing through the transistor TN104. As a result, a larger current can be extracted from the output terminal OUT.

In this operational amplifier, however, since the output node N2 on the level shift stage functions as a source follower, the potential of the node N2 is limited by the threshold of the transistor TN104. This also limits the current extracted from the output terminal OUT.

Further, the current flowing through the transistor TN104 on the output stage is difficult to estimate. Consequently, the punch-through current flowing through the transistors TP103 and TN104 cannot be controlled.

As described above, in the operational amplifiers shown in FIG. 1, a large output current cannot be obtained unless the size of the transistor on the output stage is increased, and in the operational amplifiers shown in FIG. 2, the punch-through current on the output stage cannot be controlled.

SUMMARY OF THE INVENTION

It is, therefore, an object of the present invention to provide an operational amplifier capable of increasing the output current and controlling the punch-through current.

An operational amplifier according to the present invention comprises a differential stage which receives first and second input signals, and generates and outputs a first output signal based on a difference between the first and second input signals, a level shift stage which receives the first output signal, and generates and outputs a second output signal shifted to a predetermined level, and an output stage which receives the first and second output signals, and outputs a third output signal corresponding to the difference between the first and second input signals on the basis of the first and second output signals, the level shift stage being constituted by a differential-difference amplifier, whereby the first output signal output from the differential stage and the second output signal output from the level shift stage are linear.

The level shift stage may comprise a first amplifier portion which receives the first output signal (NGP) and a first bias voltage (VBP), amplifies a difference based on a first gain (A2), and outputs a first amplification result, a second amplifier portion which receives the second output signal (NGN) and a second bias voltage (VBN), amplifies a difference based on a second gain (A1), and outputs a second amplification result, and a third amplifier portion which receives the first and second amplification results, amplifies a difference based on a third gain (A3), and outputs a third amplification result as the second output signal (NGN), the level shift stage satisfying a linear relation:

NGN=A3{A1(VBN−NGN)−A2(VBP−NGP)}

The level shift stage may comprise a first p-channel MOS transistor which has a source connected to a power supply terminal, and a gate for receiving a first bias voltage, a second p-channel MOS transistor which has a source connected to the power supply terminal, a gate for receiving a second bias voltage, and a drain connected to a drain of the first p-channel MOS transistor, a third p-channel MOS transistor which has a source connected to the power supply terminal, and a gate for receiving the second bias voltage, a fourth p-channel MOS transistor which has a source connected to the power supply terminal, a gate for receiving the second output signal, and a drain connected to a drain of the third p-channel MOS transistor, a fifth p-channel MOS transistor which has a source connected to the drains of the first and second p-channel MOS transistors, and a gate for receiving a third bias voltage, a sixth p-channel MOS transistor which has a source connected to the drains of the third and fourth p-channel MOS transistors, a gate for receiving the third bias voltage, and a drain for outputting the second output signal, a first n-channel MOS transistor which has a drain connected to a drain of the fifth p-channel MOS transistor, and a gate for receiving a fourth bias voltage, a second n-channel MOS transistor which has a drain connected to the drain of the sixth p-channel MOS transistor, and a gate for receiving the fourth bias voltage, a third n-channel MOS transistor which has a drain connected to a source of the first n-channel MOS transistor, a gate for receiving the first output signal, and a grounded source, a fourth n-channel MOS transistor which has a drain connected to the source of the first n-channel MOS transistor, a gate connected to the drain of the fifth p-channel MOS transistor, and a grounded source, a fifth n-channel MOS transistor which has a drain connected to a source of the second n-channel MOS transistor, a gate connected to the drain of the fifth p-channel MOS transistor, and a grounded source, and a sixth n-channel MOS transistor which has a drain connected to the source of the second n-channel MOS transistor, a gate for receiving the second bias voltage, and a grounded source.

Alternatively, the level shift stage may comprise a first p-channel MOS transistor which has a source connected to a power supply terminal, and a gate for receiving a second bias voltage, a second p-channel MOS transistor which has a source connected to the power supply terminal, and a gate for receiving the second bias voltage, a third p-channel MOS transistor which has a source connected to a drain of the first p-channel MOS transistor, and a gate for receiving a third bias voltage, a fourth p-channel MOS transistor which has a source connected to a drain of the second p-channel MOS transistor, and a gate for receiving the third bias voltage, a first n-channel MOS transistor which has a drain connected to a drain of the third p-channel MOS transistor, and a gate for receiving a fourth bias voltage, a second n-channel MOS transistor which has a drain connected to a drain of the fourth p-channel MOS transistor, and a gate for receiving the fourth bias voltage, a third n-channel MOS transistor which has a drain connected to the drain of the first n-channel MOS transistor, a gate connected to the drain of the third p-channel MOS transistor, and a grounded source, a fourth n-channel MOS transistor which has a drain connected to the drain of the second n-channel MOS transistor, a gate connected to the drain of the third p-channel MOS transistor, and a grounded source, a fifth n-channel MOS transistor which has a drain connected to the drain of the first p-channel MOS transistor, and a gate for receiving the first output signal, a sixth n-channel MOS transistor which has a drain connected to the drain of the second p-channel MOS transistor, and a gate for receiving the second bias voltage, a first resistor connected between sources of the fifth and sixth n-channel MOS transistors, a seventh n-channel MOS transistor which has a drain connected to the source of the fifth n-channel MOS transistor, a gate for receiving a first bias voltage, and a grounded source, an eighth n-channel MOS transistor which has a drain connected to the source of the sixth n-channel MOS transistor, a gate for receiving the first bias voltage, and a grounded source, a fifth p-channel MOS transistor which has a source connected to the power supply terminal, and a gate for receiving the second bias voltage, a sixth p-channel MOS transistor which has a source connected to the power supply terminal, and a gate for receiving the second bias voltage, a second resistor connected between the sources of the fifth and sixth p-channel MOS transistors, a seventh p-channel MOS transistor which has a source connected to a drain of the fifth p-channel MOS transistor, a gate for receiving the first bias voltage, and a source connected to a source of the first n-channel MOS transistor and a terminal for outputting the second output signal, and an eighth p-channel MOS transistor which has a source connected to a drain of the sixth p-channel MOS transistor, a gate connected to the terminal for outputting the second output signal, and a source connected to a source of the second n-channel MOS transistor.

A bias generation circuit for generating the first, second, third, and fourth bias voltages may comprise a constant current source which has one terminal connected to the power supply terminal, and the other terminal connected to a first bias voltage output terminal for outputting the first bias voltage, a seventh n-channel MOS transistor which has a drain and gate connected to the first bias voltage output terminal, and a grounded source, a seventh p-channel MOS transistor which has a source connected to the power supply terminal, and a gate and drain connected to a second bias voltage output terminal for outputting the second bias voltage, an eighth n-channel MOS transistor which has a drain connected to the gate and drain of the seventh p-channel MOS transistor, a gate connected to the first bias voltage output terminal, and a grounded source, an eighth p-channel MOS transistor which has a source connected to the power supply terminal, and a gate and drain connected to a third bias voltage output terminal for outputting the third bias voltage, a ninth n-channel MOS transistor which has a drain connected to the gate and drain of the eighth p-channel MOS transistor, a gate connected to the first bias voltage output terminal, and a grounded source, a ninth p-channel MOS transistor which has a source connected to the power supply terminal, a gate connected to the second bias voltage output terminal, and a drain connected to a fourth bias voltage output terminal for outputting the fourth bias voltage, and a 10th n-channel MOS transistor which has a drain and gate connected to the fourth bias voltage output terminal, and a grounded source.

The polarities in the operational amplifier may be inverted. In this case, the level shift stage comprises a first amplifier portion which receives the second output signal (NGP) and a first bias voltage (VBP), amplifies a difference based on a first gain (A2), and outputs a first amplification result, a second amplifier portion which receives the first output signal (NGN) and a second bias voltage (VBN), amplifies a difference based on a second gain (A1), and outputs a second amplification result, and a third amplifier portion which receives the first and second amplification results, amplifies a difference based on a third gain (A3), and outputs a third amplification result as the second output signal (NGP), the level shift stage satisfying a linear relation:

NGP=A3{A1(NGN−VBN)−A2(NGP−VBP)}

The level shift stage may comprise a first p-channel MOS transistor which has a source connected to a power supply terminal, and a gate for receiving the first output signal, a second p-channel MOS transistor which has a source connected to the power supply terminal, and a drain connected to a drain of the first p-channel MOS transistor, a third p-channel MOS transistor which has a source connected to the power supply terminal, and a gate connected to a gate of the second p-channel MOS transistor, a fourth p-channel MOS transistor which has a source connected to the power supply terminal, a gate for receiving the first bias voltage, and a drain connected to a drain of the third p-channel MOS transistor, a fifth p-channel MOS transistor which has a source connected to the drains of the first and second p-channel MOS transistors, a gate for receiving the second bias voltage, and a drain connected to the gates of the second and third p-channel MOS transistors, a sixth p-channel MOS transistor which has a source connected to the drains of the third and fourth p-channel MOS transistors, a gate for receiving the second bias voltage, and a drain for outputting the second output signal, a first n-channel MOS transistor which has a drain connected to the drain of the fifth p-channel MOS transistor, and a gate for receiving a third bias voltage, a second n-channel MOS transistor which has a drain connected to the drain of the sixth p-channel MOS transistor, and a gate for receiving the third bias voltage, a third n-channel MOS transistor which has a drain connected to a source of the first n-channel MOS transistor, a gate for receiving a fourth bias voltage, and a grounded source, a fourth n-channel MOS transistor which has a drain connected to the source of the first n-channel MOS transistor, a gate for receiving the first bias voltage, and a grounded source, a fifth n-channel MOS transistor which has a drain connected to a source of the second n-channel MOS transistor, a gate for receiving the first bias voltage, and a grounded source, and a sixth n-channel MOS transistor which has a drain connected to the source of the second n-channel MOS transistor, a gate for receiving the second output signal, and a grounded source.

Alternatively, the level shift stage may comprise a first p-channel MOS transistor which has a source connected to a power supply terminal, and a gate for receiving the first output signal, a second p-channel MOS transistor which has a source connected to the power supply terminal, a drain connected to a drain of the first p-channel MOS transistor, and a gate for receiving a fourth bias voltage, a third p-channel MOS transistor which has a source connected to the power supply terminal, and a gate connected to the gate of the second p-channel MOS transistor, a fourth p-channel MOS transistor which has a source connected to the power supply terminal, a gate for receiving the first bias voltage, and a drain connected to a drain of the third p-channel MOS transistor, a fifth p-channel MOS transistor which has a source connected to the drains of the first and second p-channel MOS transistors, and a gate for receiving the second bias voltage, a sixth p-channel MOS transistor which has a source connected to the drains of the third and fourth p-channel MOS transistors, a gate for receiving the second bias voltage, and a drain for outputting the second output signal, a first n-channel MOS transistor which has a drain connected to a drain of the fifth p-channel MOS transistor, and a gate for receiving a third bias voltage, a second n-channel MOS transistor which has a drain connected to the drain of the sixth p-channel MOS transistor, and a gate for receiving the third bias voltage, a third n-channel MOS transistor which has a drain connected to a source of the first n-channel MOS transistor, a gate for receiving the fourth bias voltage, and a grounded source, a fourth n-channel MOS transistor which has a drain connected to the source of the first n-channel MOS transistor, a gate connected to the drain of the fifth p-channel MOS transistor, and a grounded source, a fifth n-channel MOS transistor which has a drain connected to a source of the second n-channel MOS transistor, a gate connected to the gate of the fourth n-channel MOS transistor, and a grounded source, and a sixth n-channel MOS transistor which has a drain connected to the source of the second n-channel MOS transistor, a gate for receiving the second output signal, and a grounded source.

According to the operational amplifier of the present invention, since a DDA is used for the level shift stage, a signal output from the DDA and applied to the output stage can be amplified to a level in the neighborhood of the power supply voltage to improve the load drivability. In addition, the punch-through current flowing on the output stage can be controlled by controlling the level of the signal applied to the output stage.

BRIEF DESCRIPTION OF THE DRAWINGS

FIG. 5 is a circuit diagram showing the arrangement of an operational amplifier according to the second embodiment of the present invention;

FIG. 6 is a circuit diagram showing an example of the differential stage of the operational amplifier according to the first embodiment;

FIG. 7 is a circuit diagram showing another arrangement example of the differential stage of the operational amplifier according to the first embodiment;

FIG. 13 is a circuit diagram showing another example of the level shift stage in the operational amplifier.

DESCRIPTION OF THE PREFERRED EMBODIMENTS

Embodiments of the present invention will be described below with reference to the accompanying drawings.

Figure 3:
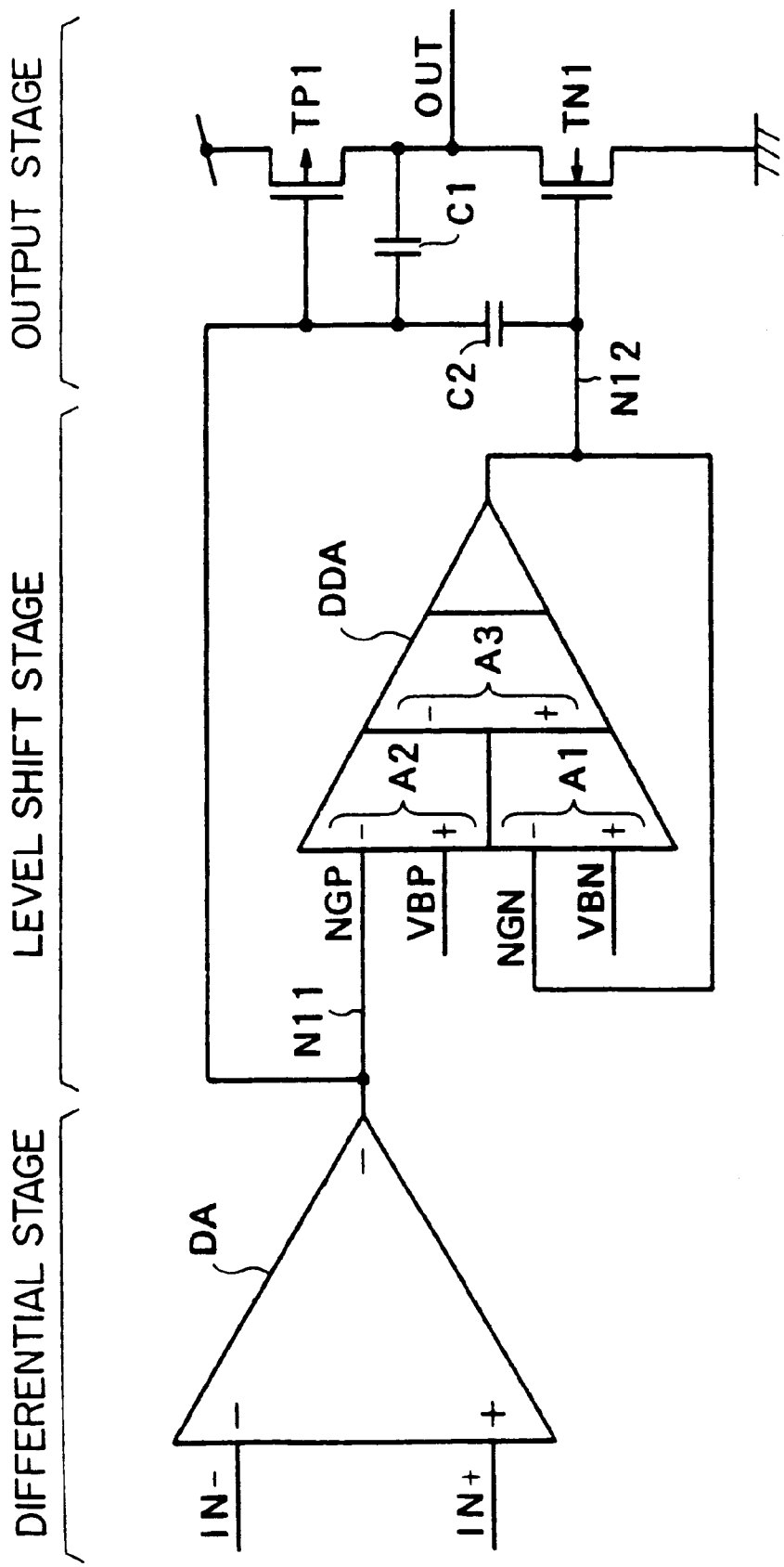
FIG. 3 is a circuit diagram showing the arrangement of an operational amplifier according to the first embodiment of the present invention.

As shown in FIG. 3, an operational amplifier according to the first embodiment comprises a differential amplifier DA serving as a differential stage, a differential-difference amplifier (to be referred to as a DDA hereinafter) serving as a level shift stage, and p- and n-channel MOS transistors TP1 and TN1 and capacitors C1 and C2 which serve as an output stage.

Figure 1:
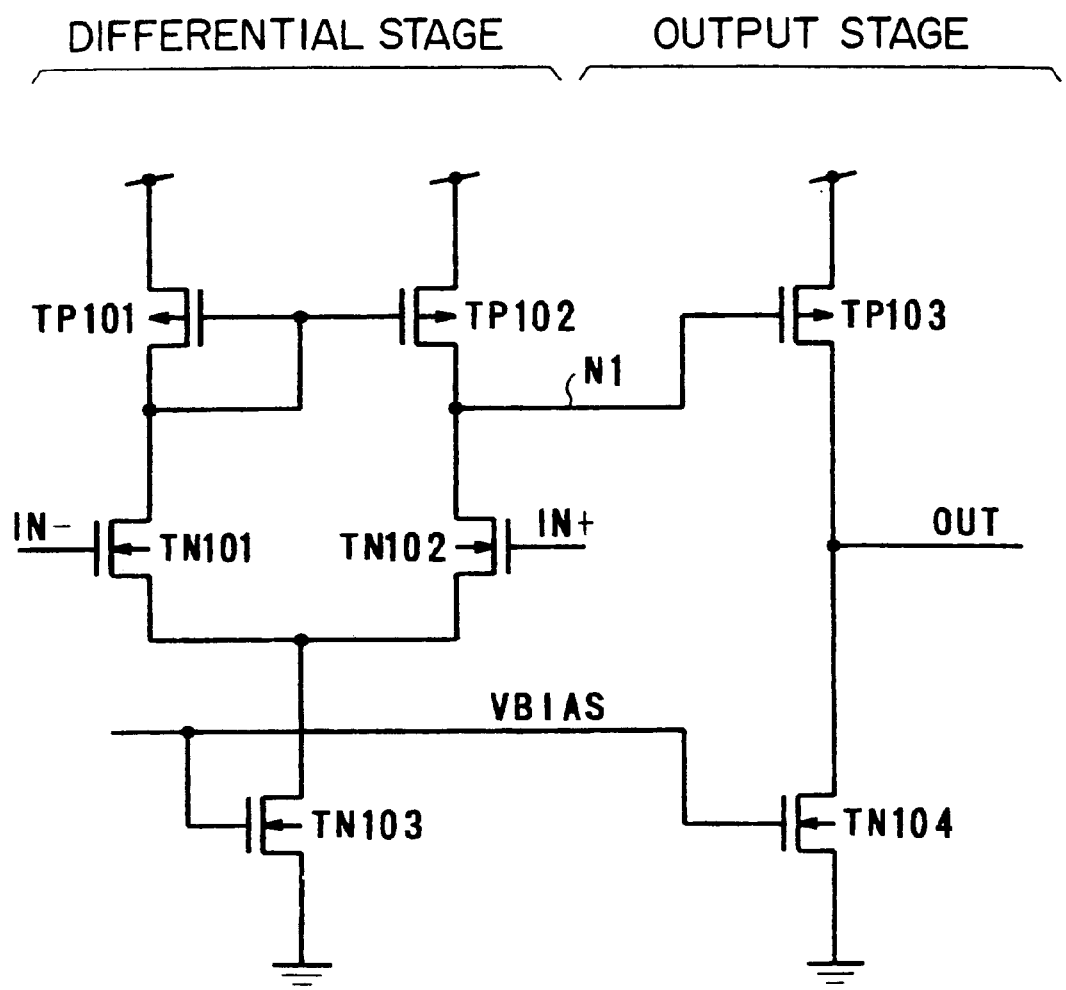
FIG. 1 is a circuit diagram showing the arrangement of an operational amplifier related to the present invention.
Figure 2:
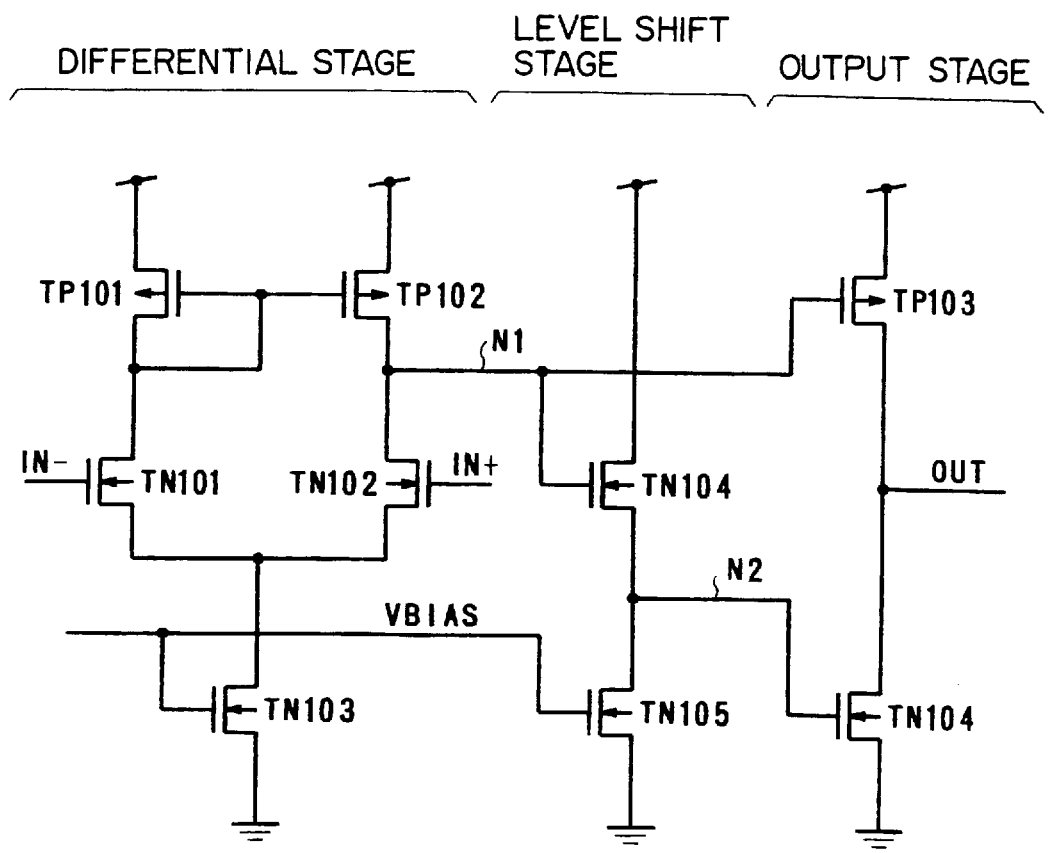
FIG. 2 is a circuit diagram showing another arrangement of the operational amplifier related to the present invention.

The differential amplifier DA serving as a differential stage may be an amplifier having p-channel MOS transistors TP101 and TP102 and n-channel MOS transistors TN101 to TN103, as shown in FIGS. 1 and 2.

The DDA is described in, e.g., "A Versatile Building Block: The CMOS Differential Difference Amplifier", IEEE J. Solid-state Circuits, vol. sc-22, p. 287, April 1987", and a detailed arrangement and operation thereof will be explained later.

The output stage comprises the p- and n-channel MOS transistors TP1 and TN1 and the capacitors C1 and C2. The transistor TP1 has a source connected to a power supply voltage terminal $V_{DD}$, a gate connected to an output node N11 on the differential amplification stage to receive an output signal NGP, and a drain connected to an output terminal OUT. The transistor TN1 has a drain connected to the output terminal OUT, a gate connected to an output node N12 on the DDA to receive an output signal NGN, and a grounded source. The capacitor C1 is connected between the gate and drain of the transistor TP1 while the capacitor C2 is connected between the gate of the transistor TP1 and the node N12 for the purpose of phase compensation.

The operational amplifier according to the first embodiment is characterized by using the DDA on the level shift stage. Reference symbol NGP denotes a signal output from the output node N11 on the differential stage DA and input to one input terminal of the DDA; NGN, a signal output from the output node N12 on the DDA and input to the other input terminal of the DDA; VBP and VBN, two kinds of bias voltages for driving the DDA; A1, the gain of an amplifier portion for receiving and differentially amplifying the signal NGN and bias voltage VBN; A2, the gain of an amplifier portion for receiving and differentially amplifying the signal NGP and bias voltage VBP; and A3, the gain of the entire DDA including these amplifier portions. In accordance with the characteristic of the DDA, the signals NGP and NGN, bias voltages VBP and VBN, and gains A1 to A3 have a linear relation:

$$NGN=A3\{A1(VBN-NGN)-A2(VBP-NGP)\} \quad (1)$$

Figure 4:
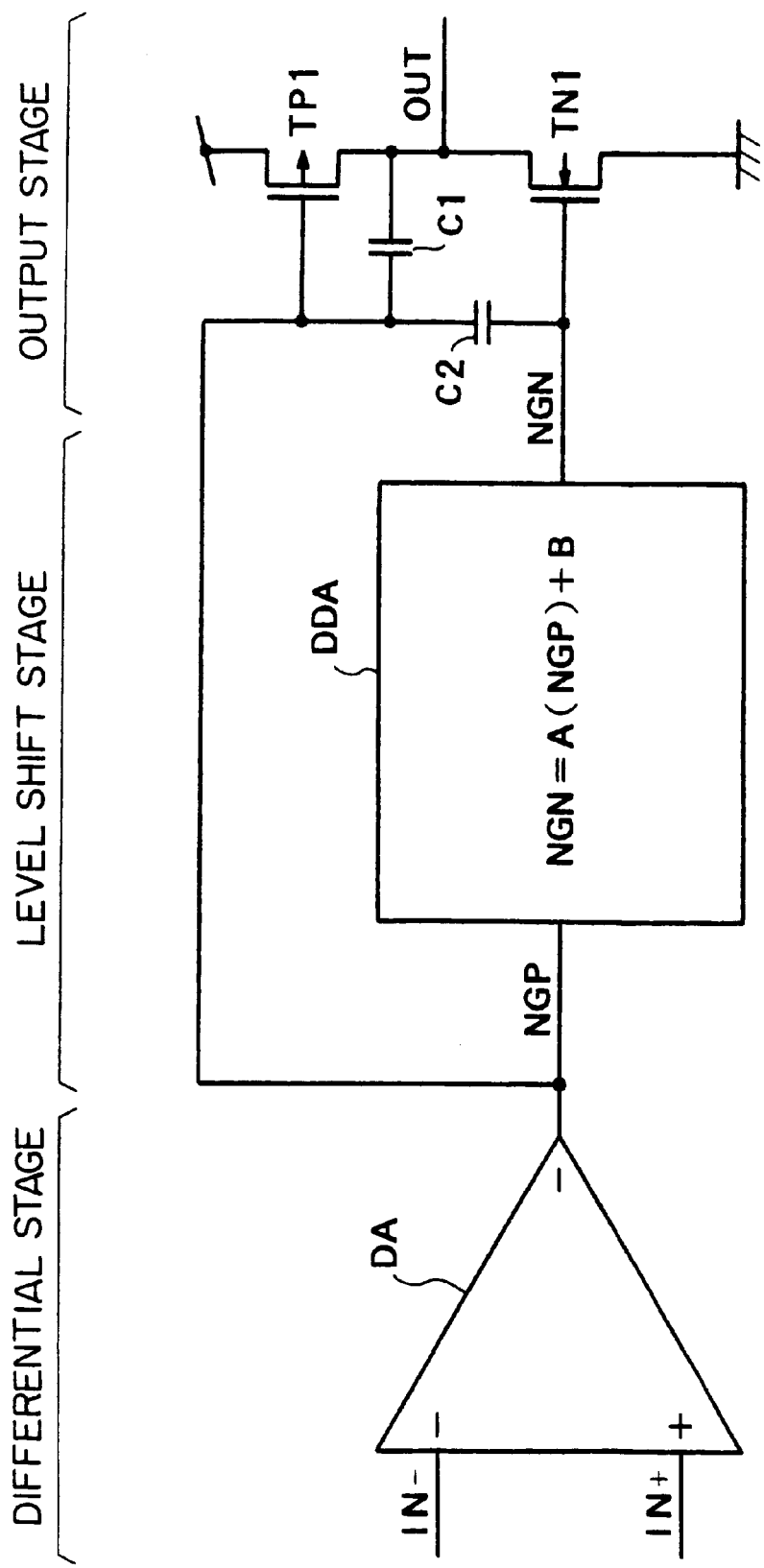
FIG. 4 is a block diagram showing the relationship between the input and output of the level shift stage in the operational amplifier.

FIG. 4 shows the arrangement of the operational amplifier in the first embodiment when this relationship is established. In FIG. 4, the DDA satisfies $$NGN=A(NGP)+B \quad (2)$$

where A and B are constants.

Assuming that A1=A2 and A1×A3>>1 among the gains A1 to A3, equation (1) can be rewritten into $$NGN=VBN+NGP-VBP \quad (3)$$

As is apparent from equation (2) or (3), since VBN and VBP are predetermined voltages, the output voltage NGP on the differential stage is level-shifted by a predetermined voltage (VBN-VBP). According to the first embodiment, since a DDA having linearity between the input and output is used for the level shift stage, the voltage of the signal NGN output from the DDA and applied to the gate of the transistor TN1 on the output stage can be amplified to a value around a power supply voltage Vcc. This allows to extract a current up to the maximum current value from the transistor TN1 and to improve the load drivability. Further, since the DDA exhibits linearity between the input and output, the punch-through current flowing between the transistors TP1 and TN1 on the output stage can be controlled by controlling the level of the signal NGN input to the gate of the transistor TN1 on the output stage.

Even when A1=A2 and A1×A3>>1 do not hold, the output signal NGN of the DDA can be adjusted to a desired value by appropriately setting the gains A1 to A3 and the bias voltages VBN and VBP. Even in this case, a large output current can be extracted, and the punch-through current can be controlled.

The operational amplifier according to the first embodiment is shown in FIG. 5 as an example of a transistor-level circuit according to the second embodiment. The differential stage comprises p-channel MOS transistors TP11 to TP17 and n-channel MOS transistors TN11 to TN14. The sources and drains of the transistors TP14 and TP16 and the drains and sources of the transistors TN11 and TN13 are series-connected between a power supply voltage terminal $V_{DD}$ and a ground voltage terminal Vss. Parallel to them, the sources and drains of the transistors TP15 and TP17 and the drains and sources of the transistors TN12 and TN14 are series-connected between the power supply voltage terminal $V_{DD}$ and the ground voltage terminal Vss. The gates of the transistors TP14 and TP15 are connected to the drain of the transistor TP16, and the gates of the transistors TP16 and TP17 receive a bias voltage VBP2. The gates of the transistors TN11 and TN12 receive a bias voltage VBN2, and the gates of the transistors TN13 and TN14 receive a bias voltage VBN1.

The sources and drains of the transistors TP11 and TP12 are series-connected between the power supply voltage terminal $V_{DD}$ and the source of the transistor TN11. The source and drain of the transistor TP13 are series-connected between the drain of the transistor TP11 and the source of the transistor TN11. The gate of the transistor TP11 receives a bias voltage VBP1, the gate of the transistor TP12 receives an input signal IN−, and the gate of the transistor TP13 receives an input signal IN+.

A high conductance can be obtained by a combination of the transistors TP12 and TP13 which respectively receive the input signals IN− and IN+, and the transistor TP11 which operates upon reception of the predetermined bias voltage VBN1.

When the gates of the transistors TP12 and TP13 respectively receive the input signals IN− and IN+, a signal prepared by amplifying the potential difference between the input signals IN− and IN+ is output from an output node N11 on the differential stage to which the drain of the transistor TP17 is connected.

The level shift stage comprises p-channel MOS transistors TP18 to TP23 and n-channel MOS transistors TN15 to TN20. The sources of the transistors TP18 and TP19 are connected to the power supply terminal, and their drains are connected to the source of the transistor TP22. The gate of the transistor TP18 receives the predetermined bias voltage VBN1, and the gate of the transistor TP19 receives the predetermined bias voltage VBP2. The sources of the transistors TP20 and TP21 are connected to the power supply terminal, and their drains are connected to the source of the transistor TP23. The gate of the transistor TP20 receives the bias voltage VBP1, and the gate of the transistor TP21 receives a signal NGN output from an output node N12 on the level shift stage. The gates of the transistors TP22 and TP23 receive the predetermined bias voltage VBP2.

The transistor TN15 has a drain connected to the drain of the transistor TP22, and a source commonly connected to the drains of the transistors TN17 and TN18. The transistor TN16 has a drain connected to the node N12, and a source commonly connected to the drains of the transistors TN19 and TN20. The gates of both the transistors TN15 and TN16 receive the predetermined bias voltage VBN2. The sources of the transistors TN17 to TN20 are grounded. The gate of the transistor TN17 is connected to the node N11, the gates of the transistors TN18 and TN19 are connected to the drains of the transistors TP22 and TN15, and the gate of the transistor TN20 receives the bias voltage VBP1.

Figure 8:
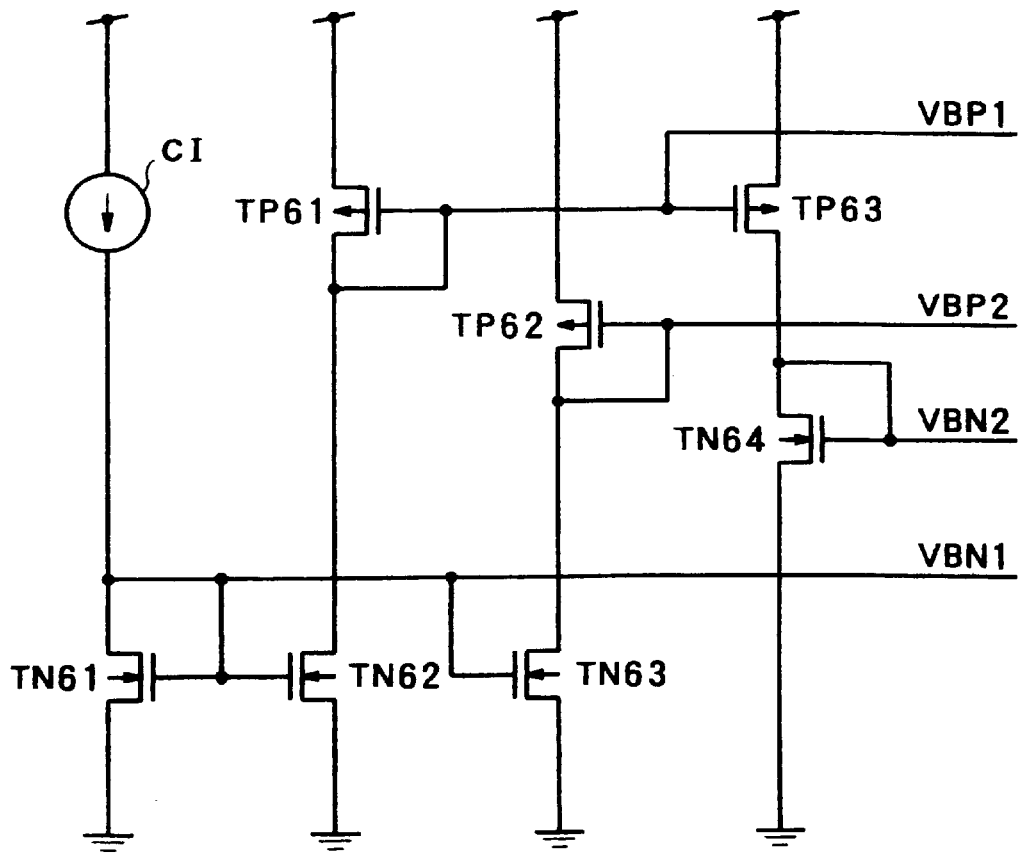
FIG. 8 is a circuit diagram showing an example of a circuit for generating a bias voltage according to the second embodiment.

The second embodiment employs four kinds of bias voltages VBP1, VBP2, VBN1, and VBN2. These bias voltages may be generated by a general bias generation circuit like the one shown in FIG. 8. This bias generation circuit comprises a constant current source CI, p-channel MOS transistors TP61 to TP63, and n-channel MOS transistors TN61 to TN63, and generates four kinds of bias voltages. The bias voltages have magnitudes that satisfy:

$$\text{VBP1} > \text{VBP2}, \text{VBN2} > \text{VBN1} \tag{4}$$

On the level shift stage, the transistors TP18 and TP21 form one amplifier portion with a gain A1, the transistors TN17 and TN20 form one amplifier portion with a gain A2, and the entire level shift stage forms an amplifier stage with a gain A3. The transistors TP19, TP20, TP22, TP23, and TN15 to TN20 correspond to a current source which operates so that the input and output of the amplifier portion including the transistors TP18 and TP21 are linear and the input and output of the amplifier portion including the transistors TN17 and TN20 are linear, i.e., these transistors operate in a non-saturation region.

Reference symbol VDS1 denotes a voltage between the source and drain of the transistor TP18; IP1, a current flowing between them; VDS2, a voltage between the source and drain of the transistor TP21; and IP2, a current flowing between them. Since the transistors TP19 and TP20 operate in a saturation region, the resistance components between their sources and drains are much smaller than the resistance components of the transistors TP18 and TP21 which operate in a non-saturation region. Accordingly, the voltages VDS1 and VDS2 are respectively determined by the transistors TP19 and TP20.

The transistors TP19 and TP20 are set equal in size, and their gates receive the bias voltage VBP1. For this reason, the voltage VDS1 is almost equal to the voltage VDS2 and serves as a voltage Vdsp. The currents IP1 and IP2 have a relation:

$$\text{IP2} - \text{IP1} = 2K \cdot \text{Vdsp}(\text{NGN} - \text{VBN1}) \tag{5}$$

$$\text{for } K = W/2L \cdot \epsilon Si/\text{tox} \cdot \mu \tag{6}$$

where W is the channel width, L is the channel length, $\epsilon Si$ is the permittivity of a silicon film, tox is the thickness of a gate oxide film, and $\mu$ is the carrier mobility in the channel.

Letting IN1 be the current flowing between the drain and source of the transistor TN17, and IN2 be the current flowing between the drain and source of the transistor TN20, the currents IN1 and IN2 have a relation:

$$\text{IN2} - \text{IN1} = 2K \cdot \text{Vdsn}(\text{VBP1} - \text{NGP}) \tag{7}$$

From equations (5) and (7), similar to equation (1), we have:

$$\text{NGN} = B3\{B1(\text{VBN1} - \text{NGN}) - B2(\text{VBP1} - \text{NGP})\} \tag{8}$$

where B1 to B3 are constants.

When a signal NGP output from the differential stage is input to the input node N11 on the level shift stage, a signal NGN is output from the output node N12 by the bias voltages VBN1 and VBP1 and the gains A1, A2, and A3.

The output stage comprises p- and n-channel MOS transistors TP24 and TN21. The transistor TP24 has a source connected to a power supply voltage terminal, a drain connected to an output terminal OUT, and a gate connected to the output node N11 on the differential stage. The transistor TN21 has a drain connected to the output terminal OUT, a grounded source, and a gate that is connected to the output node N12 on the level shift stage.

According to the second embodiment, since a DDA is used for the level shift stage, the voltage of the signal NGN applied to the gate of the transistor TN21 on the output stage can be amplified to a level near a power supply voltage Vcc. This allows to extract a current up to the maximum current value from the transistor TN21 and to improve the load drivability of the output stage. Further, since the level shift stage exhibits linearity between the input and output, the level of the signal NGN input to the gate of the transistor TN21 on the output stage can be controlled to control the punch-through current flowing between the transistors TP24 and TN21 on the output stage.

The detailed circuit arrangement of the differential stage in the first embodiment shown in FIG. 5 is not limited to the one shown in FIG. 5 and can be variously modified. FIG. 6 shows another arrangement example of the differential stage. This arrangement is the same as the differential stage in the circuit shown in FIG. 3, and comprises p-channel MOS transistors TP31 and TP32 and n-channel MOS transistors TN31 to TN33. The gates of the transistors TN31 and TN32 respectively receive input signals IN– and IN+, and the gate of the transistor TN33 receives the bias voltage VBIAS.

Alternatively, the differential stage can be constituted as shown in FIG. 7. This differential stage is called a folded cascade type differential stage, and comprises p-channel MOS transistors TP33 to TP36 and n-channel MOS transistors TN34 to TN38.

The sources of the transistors TP33 and TP34 are connected to the power supply voltage terminal, and their gates receive a bias voltage VBIAS2. The drain of the transistor TP33 is connected to the source of the transistor TP35, and the drain of the transistor TP34 is connected to the source of the transistor TP36. The gates of the transistors TP35 and TP36 receive a bias voltage VBIAS 3. The drain of the transistor TP35 is connected to the drain of the transistor TN37, and the drain of the transistor TP36 is connected to the drain of the transistor TN38 and an output terminal OUT. The gates of both the transistors TN37 and TN38 are connected to the drain of the transistor TN37, and their sources are grounded. The drain of the transistor TP33 is connected to the drain of the transistor TN35, the gate of the transistor TN35 receives an input signal IN+, the drain of the transistor TP34 is connected to the drain of the transistor TN34, and the gate of the transistor TN34 receives an input signal N-. The sources of both the transistors TN34 and TN35 are connected to the drain of the transistor TN36. The gate of the transistor TN36 receives a bias voltage VBIAS1, and its source is grounded.

In this manner, the current drivability can be enhanced compared to the differential stage shown in FIG. 4 by a combination of the transistors TN34 and TN35 whose gates respectively receive the input signals IN– and IN+, and the transistor TN36 which receives the predetermined bias voltage VBIAS1.

The level shift stage in the first embodiment is constituted as the DDA, as described above. The detailed circuit arrangement is not limited to the one shown in FIG. 5 and can be variously modified. For example, the level shift stage may be built by a DDA shown in FIG. 9. This level shift stage comprises p-channel MOS transistors TP47 to TP54, n-channel MOS transistors TN47 to TN54, and resistors R1 and R2.

The sources of both the transistors TP47 and TP48 are connected to the power supply terminal, and their gates receive a bias voltage VBP1. The drain of the transistor TP47 is connected to the source of the transistor TP49, and the drain of the transistor TP48 is connected to the source of the transistor TP51. The gates of both the transistors TP49 and TP51 receive a bias voltage VBP2. The drain of the transistor TP49 is connected to the drain of the transistor TN51, the drain of the transistor TP51 is connected to the drain of the transistor TN52, and the gates of both the transistors TN51 and TN52 receive a bias voltage VBN2. The source of the transistor TN51 is connected to the drain of the transistor TN53, and the source of the transistor TN52 is connected to the drain of the transistor TN54. The gates of both the transistors TN53 and TN54 are connected to the drain of the transistor TP49, and their sources are grounded.

The drain of the transistor TP47 is connected to the drain of the transistor TN47, the drain of the transistor TP48 is connected to the drain of the transistor TN48, the gate of the transistor TN47 receives an input signal NGP, and the gate of the transistor TN48 receives the bias voltage VBP1. The source of the transistor TN47 is connected to the drain of the transistor TN49, and the source of the transistor TN48 is connected to the drain of the transistor TN50. The gates of both the transistors TN49 and TN50 receive a bias voltage VBN1, and their sources are grounded. The sources of the transistors TN47 and TN48 are connected via the resistor R1.

The source of the transistor TN51 is connected to the drain of the transistor TP53, the source of the transistor TN52 is connected to the drain of the transistor TP54, the gate of the transistor TP53 receives the bias voltage VBN1, and the gate of the transistor TP54 is connected to a node for outputting a signal NGN. The source of the transistor TP53 is connected to the drain of the transistor TP51, and the source of the transistor TP54 is connected to the drain of the transistor TP52. The sources of both the transistors TP51 and TP52 are connected to a power supply voltage terminal, and their gates receive the bias voltage VBP1.

Figure 9:
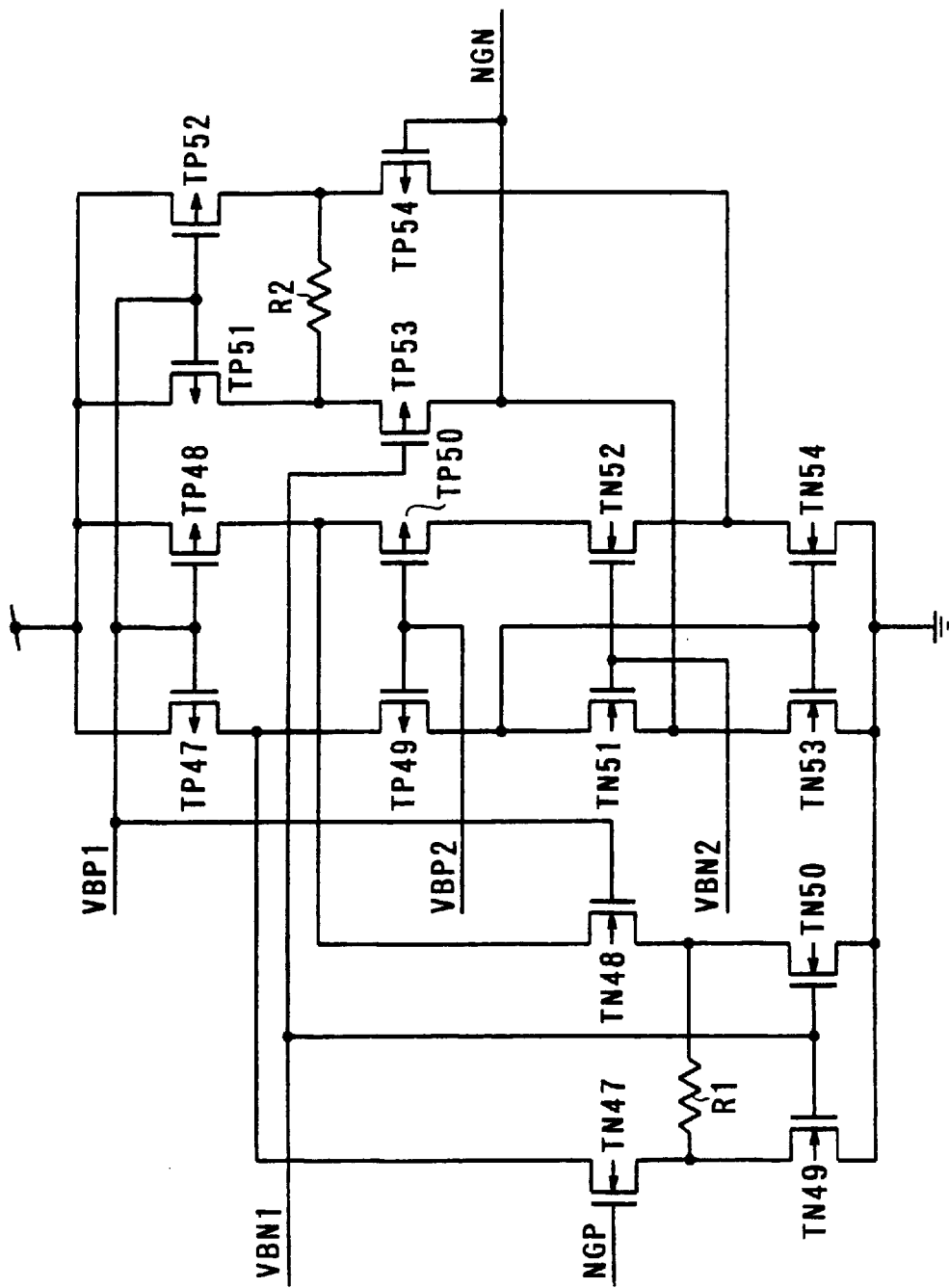
FIG. 9 is a circuit diagram showing an example of the level shift stage in the operational amplifier according to the first embodiment.

A level shift stage using the DDA shown in FIG. 9 has a larger number of elements than in the level shift stage in FIG. 3. However, the gains A1 to A3 hardly depend on the input signal NGP, and linearity between the input and output is improved.

The above-mentioned embodiments are merely examples and do not limit the present invention. For example, in the first embodiment shown in FIG. 3, an output signal NGP from the differential amplifier DA on the differential stage is input to the inverting input terminal of the DDA on the level shift stage, and an output signal NGN from the DDA is fed back to the inverting input terminal of the DDA. On the output stage, the output signal NGP on the differential stage is input to the gate of the transistor TP1, and the output signal NGN on the level shift stage is input to the gate of the transistor TN1.

Figure 10:
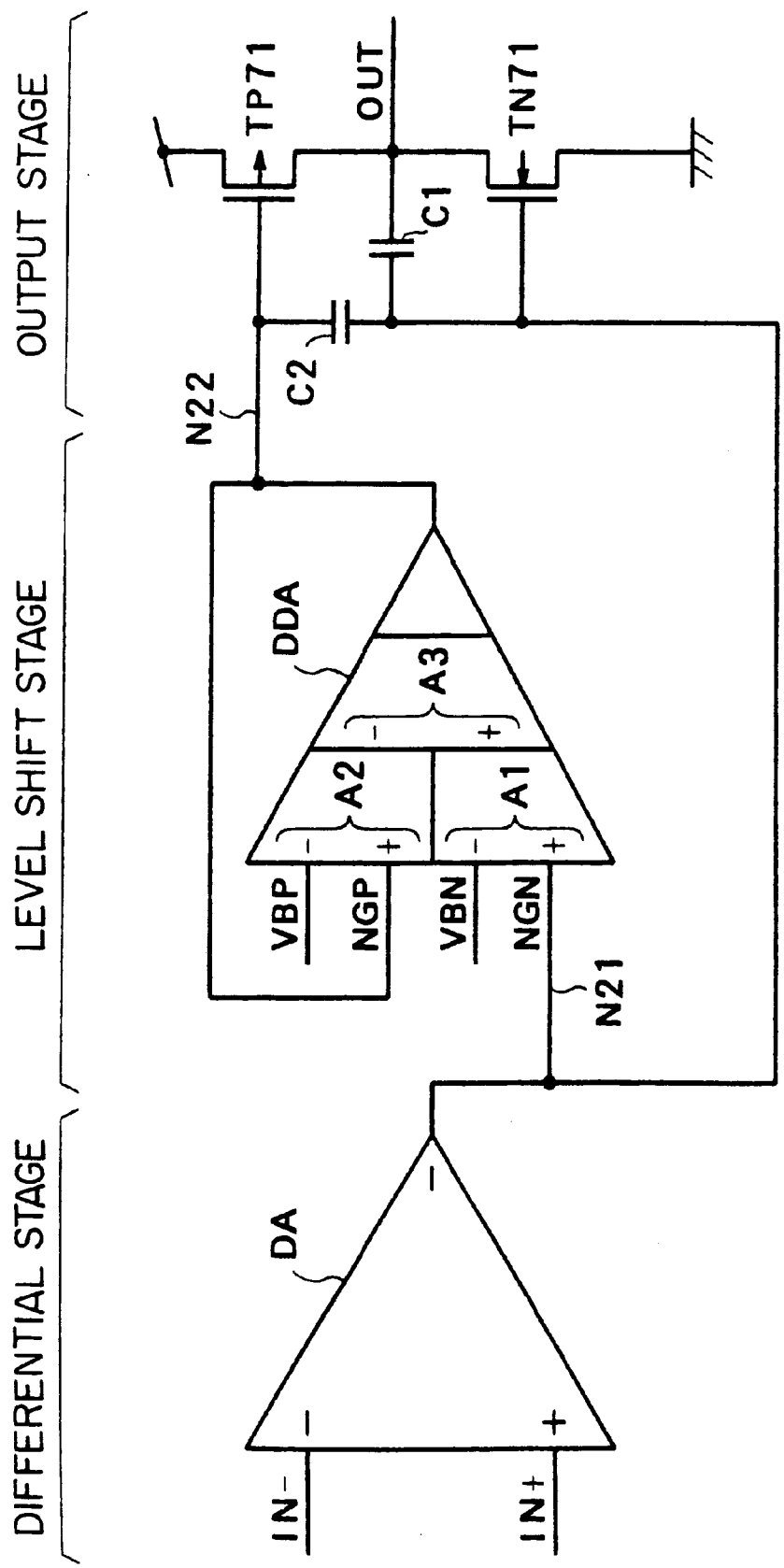
FIG. 10 is a circuit diagram showing the arrangement of an operational amplifier according to the third embodiment of the present invention.

However, all the polarities in the first embodiment may be inverted. The arrangement in this case is shown in FIG. 10 as the third embodiment. An output signal NGN from a differential amplifier DA on the differential stage is input to the non-inverting input terminal of a DDA on the level shift stage, and an output signal NGP from the DDA is fed back to the non-inverting input terminal of the DDA. On the output stage, the output signal NGN on the differential stage is input to the gate of a transistor TN71, and the output signal NGP on the level shift stage is input to the gate of a transistor TP71.

Figure 11:
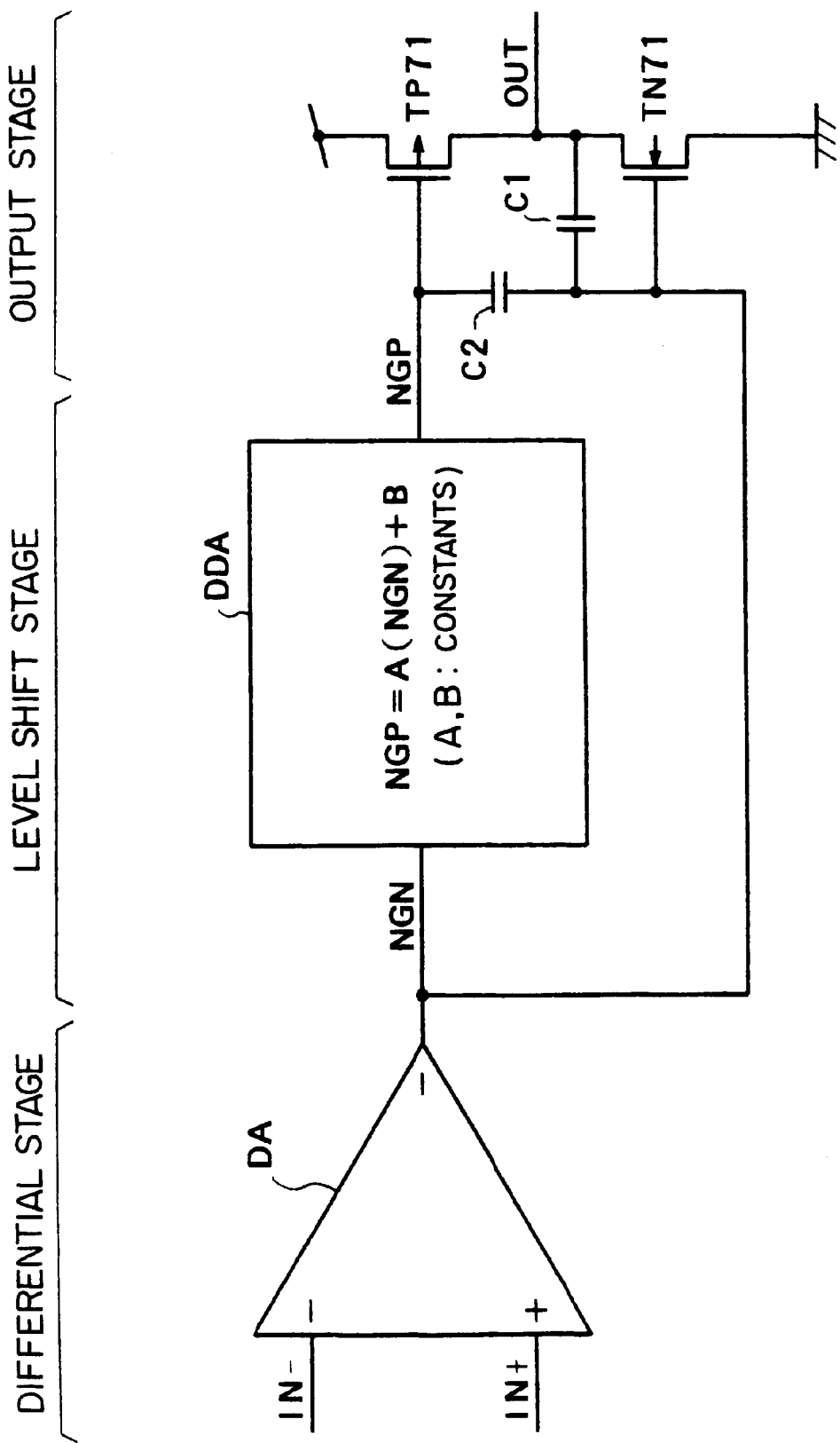
FIG. 11 is a block diagram showing the relationship between the input and output of the level shift stage in the operational amplifier.

When A1=A2 and A1×A3>>1 among the gains A1 to A3, the input signal NGN and output signal NGP on the level shift stage in the third embodiment have a relation shown in FIG. 11 given by:

$$NGP=A(NGN)+B \tag{9}$$

where A and B are constants.

Figure 12:
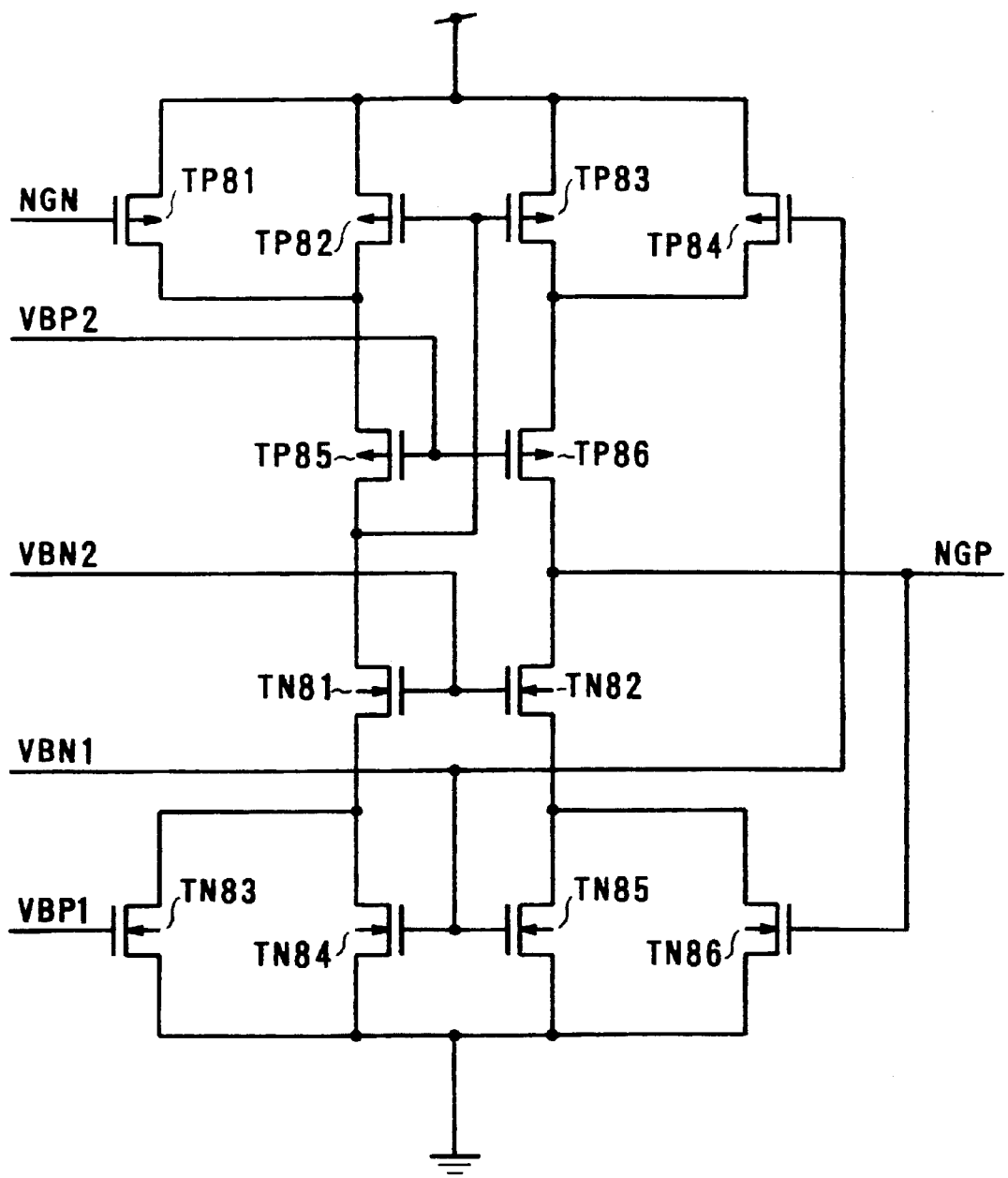
FIG. 12 is a circuit diagram showing an example of the level shift stage in the operational amplifier.

FIGS. 12 and 13 show detailed examples of the circuit arrangement of the level shift stage in the third embodiment. The level shift stage shown in FIG. 12 comprises an amplifier portion which is made up of transistors TP81 and TP84 and has a gain A1, an amplifier portion which is made up of transistors TN83 and TN86 and has a gain A2, and transistors TP82, TP83, TP85, TP86, TN81, TN82, TN84, and TN85 which are driven as a current source so as to operate the two amplifier portions within a linear range. In this level shift stage, all the polarities in the level shift stage shown in FIG. 5 are inverted.

The sources of the transistors TP81 to TP84 are connected to a power supply voltage terminal. The gate of the transistor TP81 receives an input signal NGN, the gates of both the transistors TP82 and TP83 are connected to the drain of the transistor TP85, and the gate of the transistor TP84 receives a bias voltage VBN1. The drains of the transistors TP81 and TP82 are connected to the source of the transistor TP85, the drains of the transistors TP83 and TP84 are connected to the source of the transistor TP86, and the gates of the transistors TP85 and TP86 receive a bias voltage VBP2.

The drain of the transistor TP85 is connected to the drain of the transistor TN81, the drain of the transistor TP86 is connected to the drain of the transistor TN82, and the gates of the transistors TN81 and TN82 receive a bias voltage VBN2. The source of the transistor TNB1 is connected to the drains of the transistors TN83 and TN84, and the source of the transistor TN82 is connected to the drains of the transistors TN85 and TN86. The gate of the transistor TN83 receives a bias voltage VBP1, the gates of the transistors TN84 and TN85 receive the bias voltage VBN1, the gate of the transistor TN86 receives a bias voltage NGP, and the sources of the transistors TN83 to TN86 are grounded.

In the level shift stage having this arrangement, when a signal NGN is input to the gate of the transistor TP81, a node connected to the drains of the transistors TP86 and TN82 outputs a signal NGP.

The level shift stage shown in FIG. 13 has p-channel MOS transistors TP87 to TP92 and n-channel MOS transistors TN87 to TN92. This level shift stage comprises an amplifier portion which is made up of the transistors TP87 and TP90 and has a gain A1, an amplifier portion which is made up of the transistors TN89 and TN92 and has a gain A2, and the transistors TP88, TP89, TP91, TP92, TN87, TN88, TN90, and TN91 which are driven as a current source so as to operate the two amplifier portions within a linear range.

The sources of the transistors TP87 to TP90 are connected to a power supply voltage terminal. The gate of the transistor TP87 receives an input signal NGN, the gates of both the transistors TP88 and TP89 receive a bias voltage VBP1, and the gate of the transistor TP90 receives a bias voltage VBN1. The drains of the transistors TP87 and TP88 are connected to the source of the transistor TP91, the drains of the transistors TP89 and TP90 are connected to the source of the transistor TP92, and the gates of the transistors TP91 and TP92 receive a bias voltage VBP2.

The drain of the transistor TP91 is connected to the drain of the transistor TN87, the drain of the transistor TP92 is connected to the drain of the transistor TN88, and the gates of the transistors TN87 and TN88 receive a bias voltage VBN2. The source of the transistor TN87 is connected to the drains of the transistors TN89 and TN90, the source of the transistor TN88 is connected to the drains of the transistors TN91 and TN92, and the gate of the transistor TN89 receives the bias voltage VBP1. The gates of the transistors TN90 and TN91 are connected to the drain of the transistor TP91, the gate of the transistor TN92 receives a bias voltage NGP, and the sources of the transistors TN89 to TN92 are grounded.

Also in this level shift stage, similar to the level shift stage shown in FIG. 12, when a signal NGN is input to the gate of the transistor TP87, a node connected to the drains of the transistors TP92 and TN88 outputs a signal NGP.

In this way, even if the level shift stage is constituted using a DDA in which the polarities in the first and second embodiments are inverted, the voltage of the signal NGP input to the gate of the transistor on the output stage can be amplified to a level around the power supply voltage Vcc. This allows to extract a current up to the maximum current value from the transistor TN1 on the output stage and to improve the load drivability. Moreover, the punch-through current flowing between the transistors TP1 and TN1 on the output stage can be controlled by controlling the level of the signal NGP input to the gate of the transistor TP1 on the output stage.

What is claimed is:

1. An operational amplifier, comprising:
  a differential stage which receives first and second input signals, and generates and outputs a first output signal based on a difference between the first and second input signals;
  a level shift stage which receives the first output signal, and generates and outputs a second output signal shifted to a predetermined level; and
  an output stage which receives the first and second output signals, and outputs a third output signal corresponding to the difference between the first and second input signals on the basis of the first and second output signals,
  said level shift stage being constituted by a differential-difference amplifier, whereby the first output signal output from said differential stage and the second output signal output from said level shift stage are linear;
  wherein said level shift stage comprises:
    a first amplifier portion which receives the first output signal (NGP) and a first bias voltage (VBP), amplifies a difference based on a first gain (A2), and outputs a first amplification result;
    a second amplifier portion which receives the second output signal (NGN) and a second bias voltage (VBN), amplifies a difference based on a second gain (A1), and outputs a second amplification result; and
    a third amplifier portion which receives the first and second amplification results, amplifies a difference based on a third gain (A3), and outputs a third amplification result as the second output signal (NGN), and said level shift stage satisfying a linear relation:

$$NGN = A3\{A1(VBN-NGN) - A2(VBP-NGP)\}.$$

2. An operational amplifier, comprising:
  a differential stage which receives first and second input signals, and generates and outputs a first output signal based on a difference between the first and second input signals;
  a level shift stage which receives the first output signal, and generates and outputs a second output signal shifted to a predetermined level; and
  an output stage which receives the first and second output signals, and outputs a third output signal corresponding to the difference between the first and second input signals on the basis of the first and second output signals,
  said level shift stage being constituted by a differential-difference amplifier, whereby the first output signal output from said differential stage and the second output signal output from said level shift stage are linear;
  wherein said level shift stage comprises:
    a first p-channel MOS transistor which has a source connected to a power supply terminal, and a gate for receiving a first bias voltage;
    a second p-channel MOS transistor which has a source connected to the power supply terminal, a gate for receiving a second bias voltage, and a drain connected to a drain of said first p-channel MOS transistor;
    a third p-channel MOS transistor which has a source connected to the power supply terminal, and a gate for receiving the second bias voltage;
    a fourth p-channel MOS transistor which has a source connected to the power supply terminal, a gate for receiving the second output signal, and a drain connected to a drain of said third p-channel MOS transistor;
    a fifth p-channel MOS transistor which has a source connected to the drains of said first and second p-channel MOS transistors, and a gate for receiving a third bias voltage;
    a sixth p-channel MOS transistor which has a source connected to the drains of said third and fourth p-channel MOS transistors, a gate for receiving the third bias voltage, and a drain for outputting the second output signal;
    a first n-channel MOS transistor which has a drain connected to a drain of said fifth p-channel MOS transistor, and a gate for receiving a fourth bias voltage;
    a second n-channel MOS transistor which has a drain connected to the drain of said sixth p-channel MOS transistor, and a gate for receiving the fourth bias voltage;
    a third n-channel MOS transistor which has a drain connected to a source of said first n-channel MOS transistor, a gate for receiving the first output signal, and a grounded source;
    a fourth n-channel MOS transistor which has a drain connected to the source of said first n-channel MOS transistor, a gate connected to the drain of said fifth p-channel MOS transistor, and a grounded source;
    a fifth n-channel MOS transistor which has a drain connected to a source of said second n-channel MOS transistor, a gate connected to the drain of said fifth p-channel MOS transistor, and a grounded source; and a sixth n-channel MOS transistor which has a drain connected to the source of said second n-channel MOS transistor, a gate for receiving the second bias voltage, and a grounded source.

3. An operational amplifier, comprising:

a differential stage which receives first and second input signals, and generates and outputs a first output signal based on a difference between the first and second input signals;

a level shift stage which receives the first output signal, and generates and outputs a second output signal shifted to a predetermined level; and an output stage which receives the first and second output signals, and outputs a third output signal corresponding to the difference between the first and second input signals on the basis of the first and second output signals, said level shift stage being constituted by a differential-difference amplifier, whereby the first output signal output from said differential stage and the second output signal output from said level shift stage are linear;

wherein said level shift stage comprises:
 a first p-channel MOS transistor which has a source connected to a power supply terminal, and a gate for receiving a second bias voltage;
 a second p-channel MOS transistor which has a source connected to the power supply terminal, and a gate for receiving the second bias voltage;
 a third p-channel MOS transistor which has a source connected to a drain of said first p-channel MOS transistor, and a gate for receiving a third bias voltage;
 a fourth p-channel MOS transistor which has a source connected to a drain of said second p-channel MOS transistor, and a gate for receiving the third bias voltage;
 a first n-channel MOS transistor which has a drain connected to a drain of said third p-channel MOS transistor, and a gate for receiving a fourth bias voltage;
 a second n-channel MOS transistor which has a drain connected to a drain of said fourth p-channel MOS transistor, and a gate for receiving the fourth bias voltage;
 a third n-channel MOS transistor which has a drain connected to the drain of said first n-channel MOS transistor, a gate connected to the drain of said third p-channel MOS transistor, and a grounded source;
 a fourth n-channel MOS transistor which has a drain connected to the drain of said second n-channel MOS transistor, a gate connected to the drain of said third p-channel MOS transistor, and a grounded source;
 a fifth n-channel MOS transistor which has a drain connected to the drain of said first p-channel MOS transistor, and a gate for receiving the first output signal;
 a sixth n-channel MOS transistor which has a drain connected to the drain of said second p-channel MOS transistor, and a gate for receiving the second bias voltage;
 a first resistor connected between sources of said fifth and sixth n-channel MOS transistors;
 a seventh n-channel MOS transistor which has a drain connected to the source of said fifth n-channel MOS transistor, a gate for receiving a first bias voltage, and a grounded source;
 an eighth n-channel MOS transistor which has a drain connected to the source of said sixth n-channel MOS transistor, a gate for receiving the first bias voltage, and a grounded source;
 a fifth p-channel MOS transistor which has a source connected to the power supply terminal, and a gate for receiving the second bias voltage;
 a sixth p-channel MOS transistor which has a source connected to the power supply terminal, and a gate for receiving the second bias voltage;
 a second resistor connected between the sources of said fifth and sixth p-channel MOS transistors;
 a seventh p-channel MOS transistor which has a source connected to a drain of said fifth p-channel MOS transistor, a gate for receiving the first bias voltage, and a source connected to a source of said first n-channel MOS transistor and a terminal for outputting the second output signal; and
 an eighth p-channel MOS transistor which has a source connected to a drain of said sixth p-channel MOS transistor, a gate connected to the terminal for outputting the second output signal, and a source connected to a source of said second n-channel MOS transistor.

4. An amplifier according to claim 2 or 3, wherein a bias generation circuit for generating the first, second, third, and fourth bias voltages comprises:
 a constant current source which has one terminal connected to the power supply terminal, and the other terminal connected to a first bias voltage output terminal for outputting the first bias voltage;
 a seventh n-channel MOS transistor which has a drain and gate connected to the first bias voltage output terminal, and a grounded source;
 a seventh p-channel MOS transistor which has a source connected to the power supply terminal, and a gate and drain connected to a second bias voltage output terminal for outputting the second bias voltage;
 an eighth n-channel MOS transistor which has a drain connected to the gate and drain of said seventh p-channel MOS transistor, a gate connected to the first bias voltage output terminal, and a grounded source;
 an eighth p-channel MOS transistor which has a source connected to the power supply terminal, and a gate and drain connected to a third bias voltage output terminal for outputting the third bias voltage;
 a ninth n-channel MOS transistor which has a drain connected to the gate and drain of said eighth p-channel MOS transistor, a gate connected to the first bias voltage output terminal, and a grounded source;
 a ninth p-channel MOS transistor which has a source connected to the power supply terminal, a gate connected to the second bias voltage output terminal, and a drain connected to a fourth bias voltage output terminal for outputting the fourth bias voltage; and
 a 10th n-channel MOS transistor which has a drain and gate connected to the fourth bias voltage output terminal, and a grounded source.

5. An operational amplifier, comprising:
a differential stage which receives first and second input signals, and generates and outputs a first output signal based on a difference between the first and second input signals;
a level shift stage which receives the first output signal, and generates and outputs a second output signal shifted to a predetermined level; and an output stage which receives the first and second output signals, and outputs a third output signal corresponding to the difference between the first and second input signals on the basis of the first and second output signals, said level shift stage being constituted by a differential-difference amplifier, whereby the first output signal output from said differential stage and the second output signal output from said level shift stage are linear;

wherein said level shift stage comprises:
 a first amplifier portion which receives the second output signal (NGP) and a first bias voltage (VBP), amplifies a difference based on a first gain (A2), and outputs a first amplification result;
 a second amplifier portion which receives the first output signal (NGN) and a second bias voltage (VBN), amplifies a difference based on a second gain (A1), and outputs a second amplification result; and
 a third amplifier portion which receives the first and second amplification results, amplifies a difference based on a third gain (A3), and outputs a third amplification result as the second output signal (NGP), and said level shift stage satisfying a linear relation:

$$NGP = A3\{A1(NGN-VBN) - A2(NGP-VBP)\}.$$

6. An amplifier according to claim 5, wherein said level shift stage comprises:
 a first p-channel MOS transistor which has a source connected to a power supply terminal, and a gate for receiving the first output signal;
 a second p-channel MOS transistor which has a source connected to the power supply terminal, and a drain connected to a drain of said first p-channel MOS transistor;
 a third p-channel MOS transistor which has a source connected to the power supply terminal, and a gate connected to a gate of said second p-channel MOS transistor;
 a fourth p-channel MOS transistor which has a source connected to the power supply terminal, a gate for receiving the first bias voltage, and a drain connected to a drain of said third p-channel MOS transistor;
 a fifth p-channel MOS transistor which has a source connected to the drains of said first and second p-channel MOS transistors, a gate for receiving the second bias voltage, and a drain connected to the gates of said second and third p-channel MOS transistors;
 a sixth p-channel MOS transistor which has a source connected to the drains of said third and fourth p-channel MOS transistors, a gate for receiving the second bias voltage, and a drain for outputting the second output signal;
 a first n-channel MOS transistor which has a drain connected to the drain of said fifth p-channel MOS transistor, and a gate for receiving a third bias voltage;
 a second n-channel MOS transistor which has a drain connected to the drain of said sixth p-channel MOS transistor, and a gate for receiving the third bias voltage;
 a third n-channel MOS transistor which has a drain connected to a source of said first n-channel MOS transistor, a gate for receiving a fourth bias voltage, and a grounded source;
 a fourth n-channel MOS transistor which has a drain connected to the source of said first n-channel MOS transistor, a gate for receiving the first bias voltage, and a grounded source;
 a fifth n-channel MOS transistor which has a drain connected to a source of said second n-channel MOS transistor, a gate for receiving the first bias voltage, and a grounded source; and
 a sixth n-channel MOS transistor which has a drain connected to the source of said second n-channel MOS transistor, a gate for receiving the second output signal, and a grounded source.

7. An amplifier according to claim 5, wherein said level shift stage comprises:
 a first p-channel MOS transistor which has a source connected to a power supply terminal, and a gate for receiving the first output signal;
 a second p-channel MOS transistor which has a source connected to the power supply terminal, a drain connected to a drain of said first p-channel MOS transistor, and a gate for receiving a fourth bias voltage;
 a third p-channel MOS transistor which has a source connected to the power supply terminal, and a gate connected to the gate of said second p-channel MOS transistor;
 a fourth p-channel MOS transistor which has a source connected to the power supply terminal, a gate for receiving the first bias voltage, and a drain connected to a drain of said third p-channel MOS transistor;
 a fifth p-channel MOS transistor which has a source connected to the drains of said first and second p-channel MOS transistors, and a gate for receiving the second bias voltage;
 a sixth p-channel MOS transistor which has a source connected to the drains of said third and fourth p-channel MOS transistors, a gate for receiving the second bias voltage, and a drain for outputting the second output signal;
 a first n-channel MOS transistor which has a drain connected to a drain of said fifth p-channel MOS transistor, and a gate for receiving a third bias voltage;
 a second n-channel MOS transistor which has a drain connected to the drain of said sixth p-channel MOS transistor, and a gate for receiving the third bias voltage;
 a third n-channel MOS transistor which has a drain connected to a source of said first n-channel MOS transistor, a gate for receiving the fourth bias voltage, and a grounded source;
 a fourth n-channel MOS transistor which has a drain connected to the source of said first n-channel MOS transistor, a gate connected to the drain of said fifth p-channel MOS transistor, and a grounded source;
 a fifth n-channel MOS transistor which has a drain connected to a source of said second n-channel MOS transistor, a gate connected to the gate of said fourth n-channel MOS transistor, and a grounded source; and
 a sixth n-channel MOS transistor which has a drain connected to the source of said second n-channel MOS transistor, a gate for receiving the second output signal, and a grounded source.

* * * * *